United States Patent
Gao et al.

(10) Patent No.: US 12,045,956 B2
(45) Date of Patent: Jul. 23, 2024

(54) NONUNIFORMITY CORRECTION SYSTEMS AND METHODS OF DIFFUSION-WEIGHTED MAGNETIC RESONANCE IMAGES

(71) Applicant: GE PRECISION HEALTHCARE LLC, Wauwatosa, WI (US)

(72) Inventors: Lei Gao, Beijing (CN); Juan Gao, Beijing (CN); Gaohong Wu, New Berlin, WI (US); Yongchuan Lai, Beijing (CN)

(73) Assignee: GE PRECISION HEALTHCARE LLC, Wauwatosa, WI (US)

( * ) Notice: Subject to any disclaimer, the term of this patent is extended or adjusted under 35 U.S.C. 154(b) by 664 days.

(21) Appl. No.: 17/339,345

(22) Filed: Jun. 4, 2021

(65) Prior Publication Data
US 2022/0392035 A1    Dec. 8, 2022

(51) Int. Cl.
*G06T 5/50* (2006.01)
*G01R 33/56* (2006.01)
(Continued)

(52) U.S. Cl.
CPC .......... *G06T 5/50* (2013.01); *G01R 33/5608* (2013.01); *G01R 33/56341* (2013.01);
(Continued)

(58) Field of Classification Search
CPC ............. G06T 5/50; G06T 2207/10088; G06T 2207/20212; G01R 33/5608; G01R 33/56341; G01R 33/56509
See application file for complete search history.

(56) References Cited

U.S. PATENT DOCUMENTS 10,185,017 B2 * 1/2019 Yokosawa .......... G01R 33/5608
10,718,839 B2 * 7/2020 Lai ...................... G01R 33/56
(Continued)

FOREIGN PATENT DOCUMENTS

EP    3299836 A1 * 3/2018 ......... G01R 33/5602

OTHER PUBLICATIONS

Ichikawa et al., "Improving the Quality of Diffusion-weighted Imaging of the Left Hepatic Lobe Using Weighted Averaging of Signals from Multiple Excitations", Magnetic resonance in medical sciences : MRMS : an official journal of Japan Society of Magnetic Resonance in Medicine vol. 18,3 (2019): 225-232. doi:10.2463/mrms.mp.2018-0085.

*Primary Examiner* — Ted W Barnes
(74) *Attorney, Agent, or Firm* — Armstrong Teasdale LLP

(57) ABSTRACT

A magnetic resonance (MR) imaging method of correcting nonuniformity in diffusion-weighted (DW) MR images of a subject is provided. The method includes applying a DW pulse sequence along a plurality of diffusion directions with one or more numbers of excitations (NEX), and acquiring a plurality of DW MR images of the subject along the plurality of diffusion directions with the one or more NEX. The method also includes deriving a reference image and a base image based on the plurality of DW MR images, generating a nonuniformity factor image based on the reference image and the base image, and combining the plurality of DW MR images into a combined image. The method also includes correcting nonuniformity of the combined image using the nonuniformity factor image, and outputting the corrected image.

20 Claims, 6 Drawing Sheets

(51) Int. Cl.
*G01R 33/563* (2006.01)
*G01R 33/565* (2006.01)
*G06T 5/20* (2006.01)

(52) U.S. Cl.
CPC .......... *G01R 33/56509* (2013.01); *G06T 5/20* (2013.01); *G06T 2207/10088* (2013.01); *G06T 2207/20212* (2013.01)

(56) References Cited

U.S. PATENT DOCUMENTS

| | | | | |
|---|---|---|---|---|
| 10,809,339 | B2* | 10/2020 | Li | G01R 33/543 |
| 10,871,537 | B1* | 12/2020 | Guo | G01R 33/3815 |
| 2003/0214290 | A1* | 11/2003 | van Muiswinkel | G06T 5/50 |
| | | | | 324/318 |
| 2007/0156045 | A1* | 7/2007 | Mistretta | G01R 33/4824 |
| | | | | 600/410 |
| 2007/0285091 | A1* | 12/2007 | Wen | G01R 33/4828 |
| | | | | 324/309 |
| 2010/0171498 | A1* | 7/2010 | Auslender | A61B 5/055 |
| | | | | 324/309 |
| 2011/0052031 | A1* | 3/2011 | Feiweier | G01R 33/56518 |
| | | | | 324/309 |
| 2011/0085722 | A1* | 4/2011 | Feiweier | G01R 33/56518 |
| | | | | 324/309 |
| 2011/0241679 | A1* | 10/2011 | Feiweier | G01R 33/56341 |
| | | | | 324/309 |
| 2011/0304334 | A1* | 12/2011 | Feiweier | G01R 33/56518 |
| | | | | 324/322 |
| 2012/0259199 | A1* | 10/2012 | Huwer | G01R 33/56509 |
| | | | | 324/322 |
| 2013/0285653 | A1* | 10/2013 | Zhou | G01R 33/56518 |
| | | | | 324/318 |
| 2014/0105476 | A1* | 4/2014 | Bulumulla | G06T 11/003 |
| | | | | 382/131 |
| 2015/0084628 | A1* | 3/2015 | Sato | G01R 33/243 |
| | | | | 324/309 |
| 2015/0146999 | A1* | 5/2015 | Feiweier | G06T 5/80 |
| | | | | 382/275 |
| 2017/0281041 | A1* | 10/2017 | Yokosawa | A61B 5/7207 |
| 2019/0004132 | A1* | 1/2019 | Tan | G01R 33/56 |
| 2019/0064300 | A1* | 2/2019 | Higaki | G01R 33/5608 |
| 2019/0324102 | A1* | 10/2019 | Hernando | G01R 33/5608 |
| 2019/0369192 | A1* | 12/2019 | McKay | G01R 33/56545 |
| 2020/0341088 | A1* | 10/2020 | Cao | A61B 5/055 |
| 2021/0123993 | A1* | 4/2021 | Wang | G01R 33/543 |
| 2021/0231763 | A1* | 7/2021 | Kettinger | G01R 33/56518 |

* cited by examiner

NONUNIFORMITY CORRECTION SYSTEMS AND METHODS OF DIFFUSION-WEIGHTED MAGNETIC RESONANCE IMAGES

BACKGROUND

The field of the disclosure relates generally to systems and methods of nonuniformity correction, and more particularly, to systems and methods of nonuniformity correction in diffusion-weighted magnetic resonance (MR) images.

Magnetic resonance imaging (MRI) has proven useful in diagnosis of many diseases. MRI provides detailed images of soft tissues, abnormal tissues such as tumors, and other structures, which cannot be readily imaged by other imaging modalities, such as computed tomography (CT). Further, MRI operates without exposing patients to ionizing radiation experienced in modalities such as CT and x-rays.

Diffusion-weighted MR imaging is used to study diffusion of biological tissues and diagnosis of diseases. Known diffusion-weighted MR imaging is disadvantaged in some aspects and improvements are desired.

BRIEF DESCRIPTION

In one aspect, a magnetic resonance (MR) imaging method of correcting nonuniformity in diffusion-weighted (DW) MR images of a subject is provided. The method includes applying a DW pulse sequence along a plurality of diffusion directions with one or more numbers of excitations (NEX), and acquiring a plurality of DW MR images of the subject along the plurality of diffusion directions with the one or more NEX. The method also includes deriving a reference image and a base image based on the plurality of DW MR images, generating a nonuniformity factor image based on the reference image and the base image, and combining the plurality of DW MR images into a combined image. The method also includes correcting nonuniformity of the combined image using the nonuniformity factor image, and outputting the corrected image.

In another aspect, a nonuniformity correction system of correcting nonuniformity in DW MR images of a subject is provided. The system includes a nonuniformity correction computing device, the nonuniformity correction computing device including at least one processor in communication with at least one memory device. The at least one processor is programmed to receive a plurality of DW MR images of the subject along a plurality of diffusion directions with one or more numbers of excitations (NEX), derive a reference image and a base image based on the plurality of DW MR images, generate a nonuniformity factor image based on the reference image and the base image, and combine the plurality of DW MR images into a combined image. The at least one processor is also programmed to correct nonuniformity of the combined image using the nonuniformity factor image, and output the corrected image.

DRAWINGS

DETAILED DESCRIPTION

The disclosure includes systems and methods of reducing shading or correcting nonuniformity in diffusion-weighted magnetic resonance (MR) images of a subject. As used herein, a subject is a human, an animal, or a phantom. Reducing shading or correcting nonuniformity as used herein is reduction and/or removal of shading or nonuniformity in diffusion-weighted MR images. Liver diffusion imaging is described herein as an example only. The systems and methods disclosed herein may be applied to correct shading in diffusion images of other parts of the body, such as the pancreas. Method aspects will be in part apparent and in part explicitly discussed in the following description.

In magnetic resonance imaging (MRI), a subject is placed in a magnet. When the subject is in the magnetic field generated by the magnet, magnetic moments of nuclei, such as protons, attempt to align with the magnetic field but precess about the magnetic field in a random order at the nuclei's Larmor frequency. The magnetic field of the magnet is referred to as B0 and extends in the longitudinal or z direction. In acquiring an MRI image, a magnetic field (referred to as an excitation field B1), which is in the x-y plane and near the Larmor frequency, is generated by a radio-frequency (RF) coil and may be used to rotate, or "tip," the net magnetic moment Mz of the nuclei from the z direction to the transverse or x-y plane. A signal, which is referred to as an MR signal, is emitted by the nuclei, after the excitation signal B1 is terminated. To use the MR signals to generate an image of a subject, magnetic field gradient pulses (Gx, Gy, and Gz) are used. The gradient pulses are used to scan through the k-space, the space of spatial frequencies or inverse of distances. A Fourier relationship exists between the acquired MR signals and an image of the subject, and therefore the image of the subject can be derived by reconstructing the MR signals.

Figure 1A:
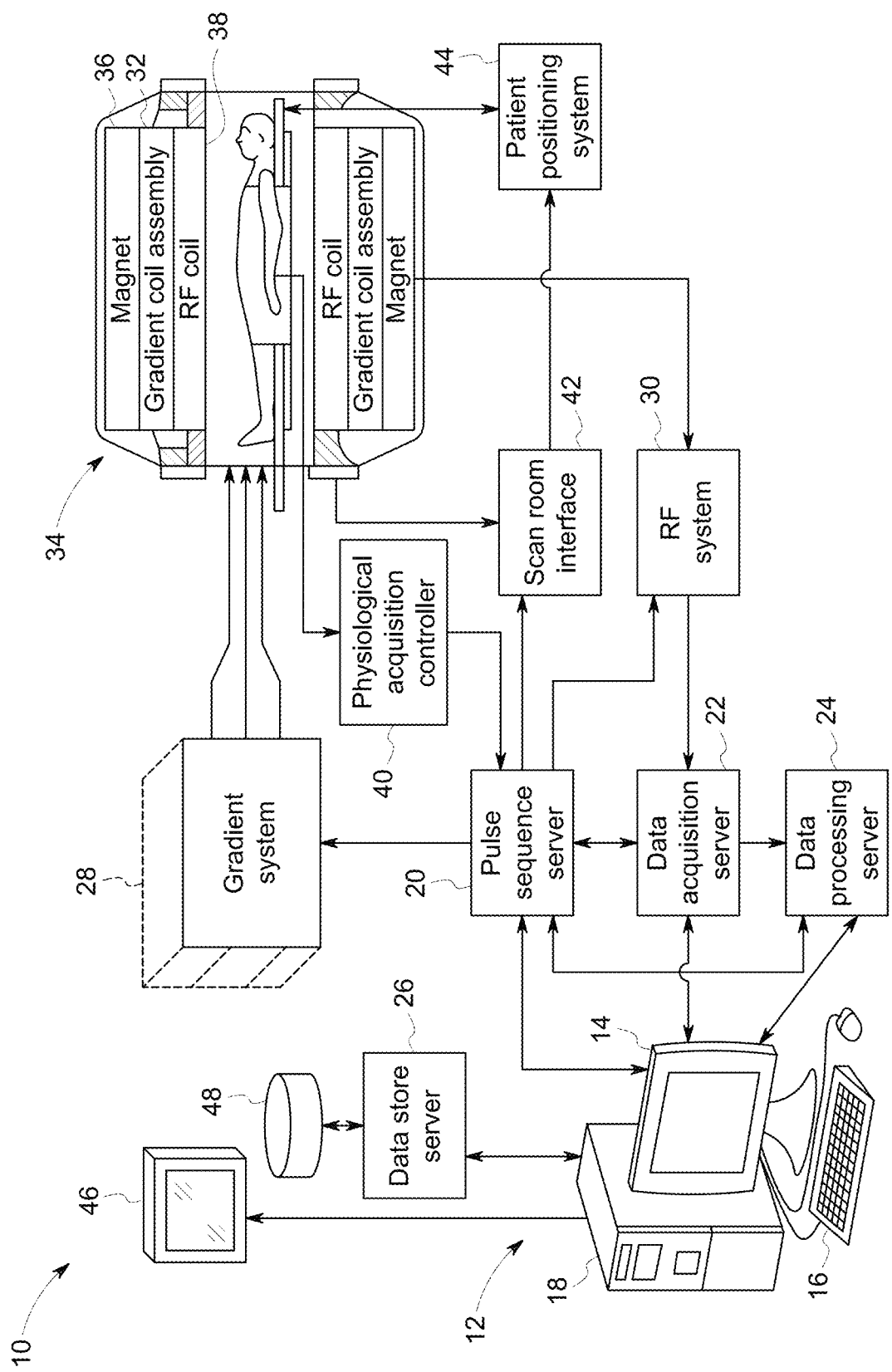
FIG. 1A is a schematic diagram of an exemplary magnetic resonance imaging (MRI) system.

FIG. 1 illustrates a schematic diagram of an exemplary MRI system 10. In the exemplary embodiment, the MRI system 10 includes a workstation 12 having a display 14 and a keyboard 16. The workstation 12 includes a processor 18, such as a commercially available programmable machine running a commercially available operating system. The workstation 12 provides an operator interface that allows scan prescriptions to be entered into the MRI system 10. The workstation 12 is coupled to a pulse sequence server 20, a data acquisition server 22, a data processing server 24, and a data store server 26. The workstation 12 and each server 20, 22, 24, and 26 communicate with each other.

In the exemplary embodiment, the pulse sequence server 20 responds to instructions downloaded from the workstation 12 to operate a gradient system 28 and a radiofrequency ("RF") system 30. The instructions are used to produce gradient and RF waveforms in MR pulse sequences. An RF coil 38 and a gradient coil assembly 32 are used to perform the prescribed MR pulse sequence. The RF coil 38 is shown as a whole body RF coil. The RF coil 38 may also be a local coil that may be placed in proximity to the anatomy to be imaged, or a coil array that includes a plurality of coils.

In the exemplary embodiment, gradient waveforms used to perform the prescribed scan are produced and applied to the gradient system 28, which excites gradient coils in the gradient coil assembly 32 to produce the magnetic field gradients $G_x$, $G_y$, and $G_z$ used for frequency encoding, phase encoding, and slice selection/encoding of MR signals. The gradient coil assembly 32 forms part of a magnet assembly 34 that also includes a polarizing magnet 36 and the RF coil 38.

In the exemplary embodiment, the RF system 30 includes an RF transmitter for producing RF pulses used in MR pulse sequences. The RF transmitter is responsive to the scan prescription and direction from the pulse sequence server 20 to produce RF pulses of a desired frequency, phase, and pulse amplitude waveform. The generated RF pulses may be applied to the RF coil 38 by the RF system 30. Responsive MR signals detected by the RF coil 38 are received by the RF system 30, amplified, demodulated, filtered, and digitized under direction of commands produced by the pulse sequence server 20. The RF coil 38 is described as a transmitter and receiver coil such that the RF coil 38 transmits RF pulses and detects MR signals. In one embodiment, the MRI system 10 may include a transmitter RF coil that transmits RF pulses and a separate receiver coil that detects MR signals. A transmission channel of the RF system 30 may be connected to a RF transmission coil and a receiver channel may be connected to a separate RF receiver coil. Often, the transmission channel is connected to the whole body RF coil 38 and each receiver section is connected to a separate local RF coil.

In the exemplary embodiment, the RF system 30 also includes one or more RF receiver channels. Each RF receiver channel includes an RF amplifier that amplifies the MR signal received by the RF coil 38 to which the channel is connected, and a detector that detects and digitizes the I and Q quadrature components of the received MR signal. The magnitude of the received MR signal may then be determined as the square root of the sum of the squares of the I and Q components as in Eq. (1) below:

$$M = \sqrt{I^2 + Q^2} \qquad (1);$$

and the phase of the received MR signal may also be determined as in Eq. (2) below:

$$\varphi = \tan^{-1}\left(\frac{Q}{I}\right). \qquad (2)$$

In the exemplary embodiment, the digitized MR signal samples produced by the RF system 30 are received by the data acquisition server 22. The data acquisition server 22 may operate in response to instructions downloaded from the workstation 12 to receive real-time MR data and provide buffer storage such that no data is lost by data overrun. In some scans, the data acquisition server 22 does little more than pass the acquired MR data to the data processing server 24. In scans that need information derived from acquired MR data to control further performance of the scan, however, the data acquisition server 22 is programmed to produce the needed information and convey it to the pulse sequence server 20. For example, during prescans, MR data is acquired and used to calibrate the pulse sequence performed by the pulse sequence server 20. Also, navigator signals may be acquired during a scan and used to adjust the operating parameters of the RF system 30 or the gradient system 28, or to control the view order in which k-space is sampled.

In the exemplary embodiment, the data processing server 24 receives MR data from the data acquisition server 22 and processes it in accordance with instructions downloaded from the workstation 12. Such processing may include, for example, Fourier transformation of raw k-space MR data to produce two or three-dimensional images, the application of filters to a reconstructed image, the generation of functional MR images, and the calculation of motion or flow images.

In the exemplary embodiment, images reconstructed by the data processing server 24 are conveyed back to, and stored at, the workstation 12. In some embodiments, real-time images are stored in a database memory cache (not shown in FIG. 1), from which they may be output to operator display 14 or a display 46 that is located near the magnet assembly 34 for use by attending physicians. Batch mode images or selected real time images may be stored in a host database on disc storage 48 or on a cloud. When such images have been reconstructed and transferred to storage, the data processing server 24 notifies the data store server 26. The workstation 12 may be used by an operator to archive the images, produce films, or send the images via a network to other facilities.

The systems and methods disclosed herein are used to reduce shading or correct nonuniformity in diffusion-weighted images. Diffusion refers to the random, microscopic movement of water and other small molecules due to thermal agitation, and is also known as Brownian motion. In vivo, extracellular water generally diffuses somewhat more freely than intracellular water because the latter has more chances to collide with cell walls, organelles, macromolecules, and the like. Diffusion may be isotropic, where the water molecules diffuse equally in all directions around the water molecules, which occurs in fluids and some homogenous solid materials like gels. Biological tissues, on the other hand, contain asymmetric structures, which creates diffusion anisotropy, a preferential diffusion of water molecules in certain directions more than others. Diseases may increase or decrease the diffusion of water in tissues. For example, diffusion times are often prolonged in many non-acute and chronic diseases, while reduction in tissue diffusion may occur in diseases such as acute ischemia, infections, and high cellular tumors.

Diffusion is characterized by diffusion coefficient D, which represents the flux of water or small particles via Brownian motion across a surface during a period of time, and has a unit of area/time, e.g., in $mm^2$/second. For isotropic diffusion, diffusion can be characterized by a single diffusion coefficient D. For anisotropic diffusion, diffusion coefficient D is a tensor, a 3×3 matrix containing elements such as Dxx, Dxy, and Dxz, which represent diffusion rates along different directions.

Figure 1B:
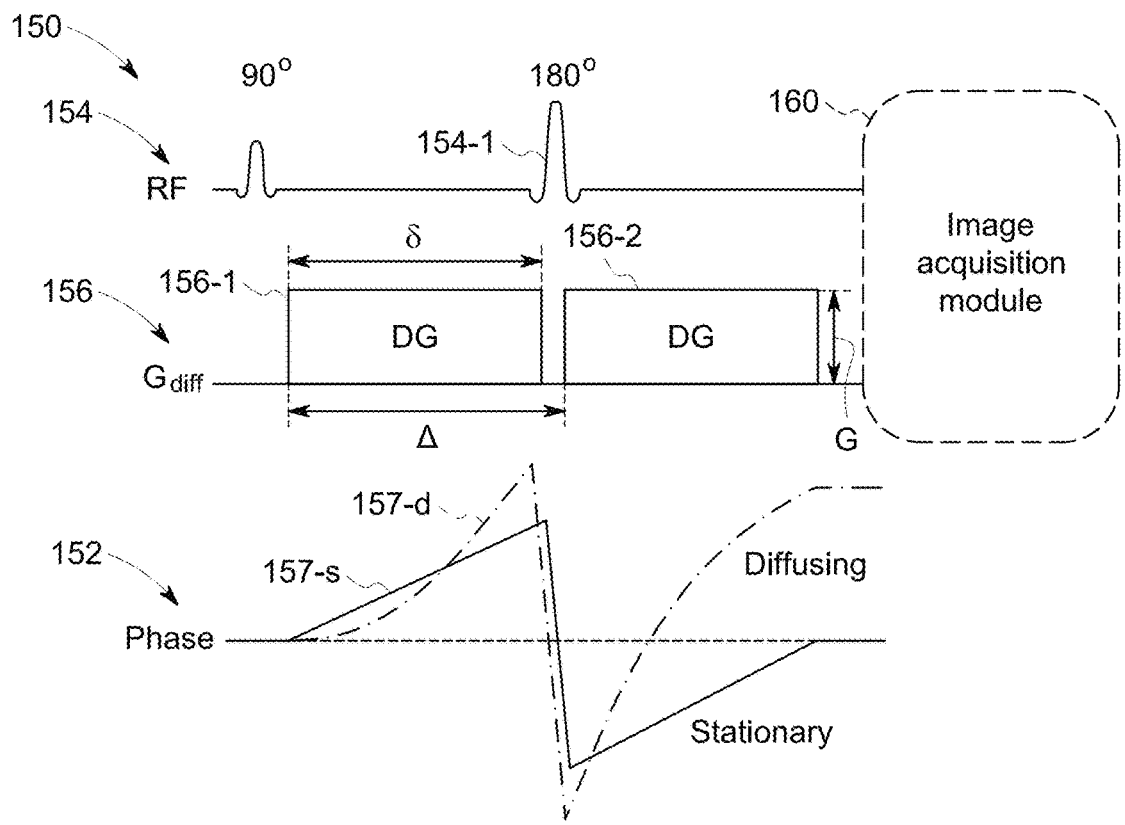
FIG. 1B is a schematic diagram of a diffusion-weighted pulse sequence.

Compared to other imaging modalities, MRI is unique in that an MRI signal is represented by a complex number, rather than a scalar or a real number. The image value for each image pixel, therefore, includes a magnitude and a phase. Complex MR images may be reconstructed based on I and Q quadrature MR signals, using processes such as Fourier transform. In MR, diffusion is studied and measured by diffusion-weighted or diffusion MR imaging, using diffusion-weighted pulse sequences, where individual elements of the diffusion tensor are estimated by measuring phase dispersing and signal loss as diffusion-sensitizing, diffusion-weighting, or diffusion gradients are applied in various directions. In MR, a pulse sequence is a sequence of RF pulses, gradient pulses, and data acquisition applied by the MRI system 10 in acquiring MR signals. FIG. 1B is an exemplary diffusion-weighted (DW) sequence 150. The phases 152 of spins or spin angular momentum are plotted along the same timeline as the RF pulses 154 and diffusion gradients 156, to show the evolution of the phases during application of diffusion gradients 156. The pulse sequence 150 further includes image acquisition module 160, i.e., part of the pulse sequence 150 for acquiring diffusion-weighted images, such as a fast spin echo sequence or an echo-planar imaging sequence. A DW pulse sequence 150 may include diffusion-sensitizing gradients (DG) 156 on either side of a 180° RF pulse 158. The phases of stationary spins (line 157-s) are unaffected by the DG pairs 156-1, 156-2 because any phase accumulation from the first gradient lobe 156-1 is reversed by the second gradient lobe 156-2. Diffusing spins, however, move into different locations between the first and second lobes 156-1, 156-2, falling out of phase and losing signal (see line 157-d). The signal S after the diffusion gradients have applied is given by the below equation:

$$S = S_0 e^{-bD}, \quad (3)$$

where $S_0$ is the MR signal before the application of the diffusion gradients, and b or the b-value is a factor that reflects the strength and timing of the diffusion gradients used to generate diffusion-weighted images. In the pulse sequence 150, $b = \gamma^2 G^2 \delta^2 (\Delta - \delta/3)$, where $\gamma$ is a gyromagnetic ratio of a nucleus such as protons, G is the magnitude of the diffusion gradient 156, $\delta$ is the duration of the diffusion gradient 156, and $\Delta$ is the time interval between the two lobes 156-1, 156-2. b also depends on the shape of the diffusion gradient pulses 156-1, 156-2. The amount of diffusion weighting may be changed by changing b-values. The direction of diffusion weighting may be changed by applying the diffusion gradients 156 in different directions. For example, diffusion gradients 156 may be in the read-out direction (x), phase-encoding direction (y), slice-selection or second phase-encoding direction (z), or any combination of x, y, and/or z. As a result, the rates and the directions of the diffusion coefficient may be estimated based on the diffusion-weighted images and Eqn. (3). An apparent diffusion coefficient (ADC) is a typically-estimated diffusion coefficient, which is the mean diffusion in a voxel taking as the sum or average value of the diffusion tensor's diagonal elements. An ADC map reflects the rates of diffusion in the voxels.

Figure 2:
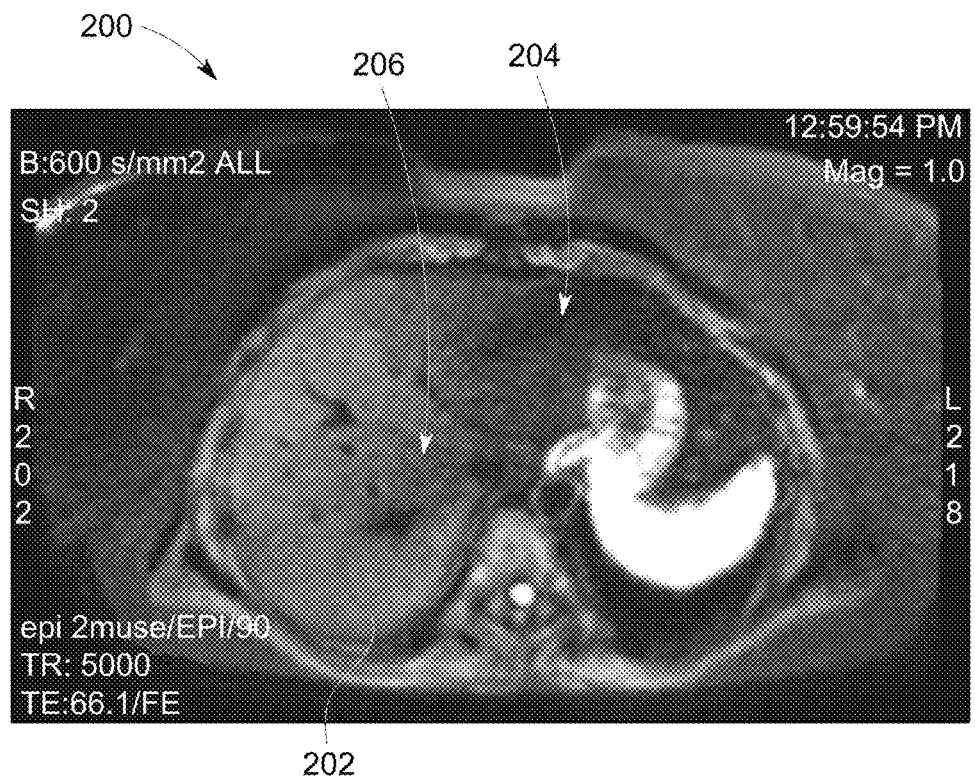
FIG. 2 is a diffusion-weighted image without using the systems and methods disclosed herein.

Because diffusion-weighted imaging is designed to be sensitized to motion, motion other than diffusion, such as tissue movement, affects diffusion-weighted images. For example, in abdominal diffusion-weighted imaging, liver tissue moves due to cardiac motion and/or breathing, and signals in those areas are lost because of the motion. Signal loss is present even during breath-holding diffusion-weighted imaging, because cardiac motion is unaffected by breath holding. As a result, part of diffusion-weighted images appear darker that other part of the images, incorrectly showing as having higher diffusion rates. FIG. 2 is a diffusion-weighted image 200 of a subject without using systems and methods disclosed herein. The image 200 shows a liver 202 of the subject. The image 200 is acquired with a diffusion weighting b=600 s/mm². As shown in the image 200, the intensity of the image 200 is not uniform, with intensity at a location 204 is much darker or has a much lower signal intensity than at a location 206. The shading is likely caused by phase changes from cardiac motion. The shading is more severe at a higher b value, because diffusion-weighting amplifies effects of motion.

Systems and methods described herein are used to reduce shading and correct nonuniformity of diffusion-weighted images without a separately-provided reference image to be used for correction. The accuracy of estimated diffusion coefficients is greatly increased.

Figure 3A:
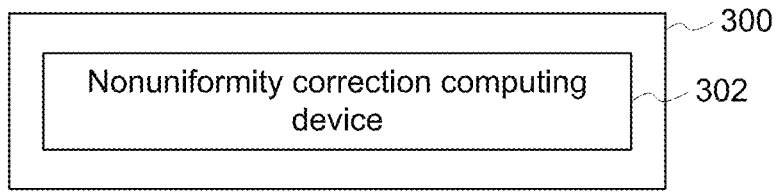
FIG. 3A is an exemplary nonuniformity correction system.

FIG. 3A is a schematic diagram of an exemplary nonuniformity correction system 300. In the exemplary embodiment, the system 300 includes a nonuniformity correction computing device 302 configured to correct nonuniformity of MR images. The nonuniformity correction computing device 302 may be included in the workstation 12 of the MRI system 10, or may be included in a separate computing device that is in communication with the workstation 12, through wired or wireless communication. In some embodiments, the nonuniformity correction computing device 302 is a separate computing device from the workstation 12 and receives MR images acquired by the workstation 12 through a portable storage device, such as a flash drive or a thumb drive.

Figure 3B:
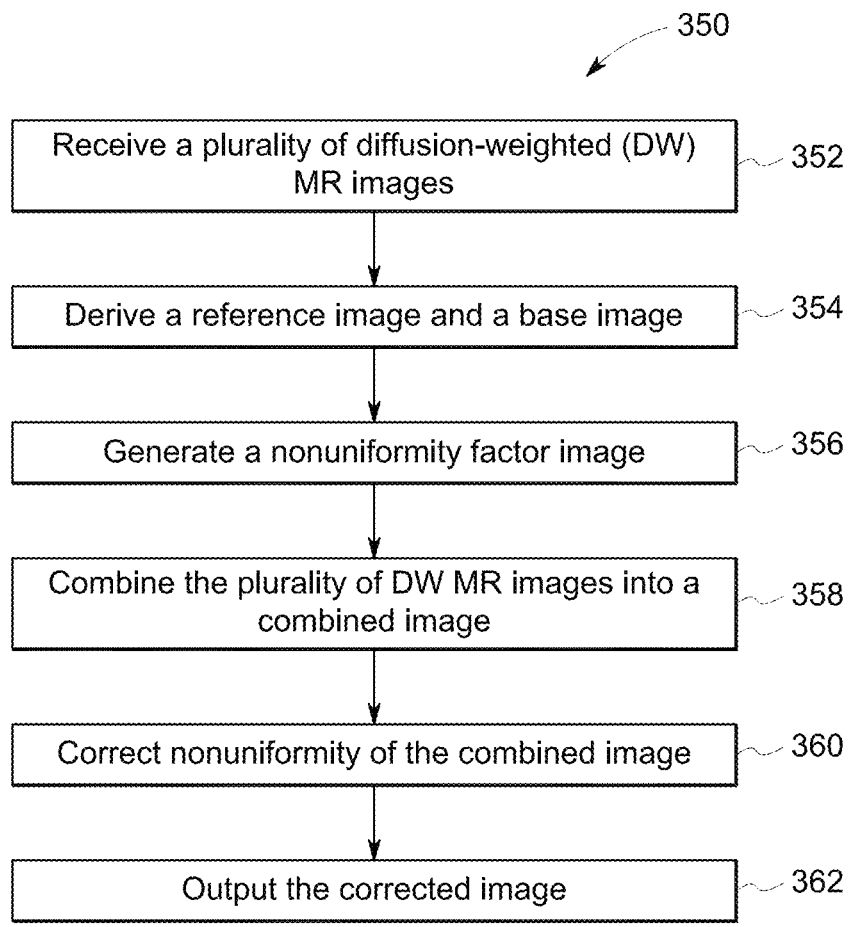
FIG. 3B is a flow chart of an exemplary method of nonuniformity correction.

FIG. 3B is a flow chart of an exemplary method 350. The method 350 may be implemented on the nonuniformity correction computing device 302. In the exemplary embodiment, the method includes receiving 352 a plurality of diffusion-weighted (DW) MR images $I_{inexdir}$ along a plurality of diffusion-weighting directions with one or more numbers of excitations (NEX). For example, the diffusion-weighting direction may be in the superior-inferior (SI), left-right (LR), anterior-posterior (AP) directions, or any other directions not along the three orthogonal axes. NEX is the number of repetitions of scanning through the k-space or the proportion of the k-space being scanned. NEX of greater than 1 is used to increase the signal to noise ratio (SNR) of the image.

In the exemplary embodiment, the method 350 further includes deriving 354 a reference image and a base image based on the plurality of DW MR images. The plurality of DW MR images may be denoted as $I_{inexdir}$. When scanning with DWI using multi-NEX and multi-directions, an image from each NEX and direction $I_{iNexjDir}$ is acquired. The phases of each $I_{iNexjDir}$ are not the same with one another because of diffusion gradients and motion, In some embodiments, phases are removed for each $I_{iNexjDir}$ to get $I_{inexdir}$. For example, an MR image is expressed into the magnitude and phase parts as:

$$I_{iNexjDir} = \text{abs}(I_{iNexjDir}) e^{angle(I_{iNexjDir})}, \quad (4)$$

where $\text{abs}(I_{iNexjDir})$ is the absolute value or magnitude of the image at a pixel, and angle(iNexjDir) is the phase of the image at the pixel. The phases of the image $I_{iNexjDir}$ may be removed by subtracting the phases as below:

$$I_{inexdir} = \text{abs}(I_{iNexjDir}) e^{angle(I_{iNexjDir}) - angle([I_{iNexjDir}]_{lowpass})}, \quad (5)$$

where $$\text{angle}\left([I_{iNexjDir}]_{lowpass}\right)$$

is the phase of the image after being applied with a low-pass filter, which weights pixels around the center of k-space higher than pixels at the periphery of the k-space. The region around the center of the k-space, referred to as a central region, corresponds to low spatial frequencies. The region at the periphery of the k-space, referred to as a peripheral region, corresponds to high spatial frequencies. The signal-to-noise ratio (SNR) in the central region is typically higher than that in the peripheral region. A low-pass filter smooths an image, reduce spikes in the peripheral region, and increase the overall SNR of the image. Applying a low-pass filter may decrease the resolution of the image because signals at high spatial frequencies are reduced from the filtering. An exemplary low-pass filter is a Hanning window or a modified Hanning window, which weights the region around the center of the k-space heavier than the Hanning window. The phase removal does not change image magnitude, but only changes image phases. After phase removal, the phases of signals are almost reduced to 0, and the phases of noise is a Gaussian random distribution in $-\pi$ to $\pi$.

In the exemplary embodiment, the base image is a combined image of the plurality of DW images. The plurality of DW images may be phase removed, or may be without phase removal. Phase removal increases the accuracy of the DW images and estimation of diffusion coefficients such as ADC by keeping phases among diffusion directions and NEX consistent with each other. The plurality of DW images may be applied with a low-pass filter before the combination to derive the base image. An exemplary low-pass filter is a Hanning window or a modified Hanning window.

In one example, a base image may be an arithmetic average of DW images $I_{inexdir}$ by the number of NEX and geometric average of the DW images $I_{inexdir}$ by the number of directions as:

$$I_d = \frac{1}{NEX}\sum_{n=1}^{NEX} I_n, \text{ and } I_{cmb} = \sqrt[N_{dir}]{\prod_{d=1}^{N_{dir}} \text{abs}(I_d)}. \tag{6}$$

In some embodiments, the base image is one of the plurality of DW images $I_{inexdir}$, with or without phase removal.

In another example, the base image is a square root of a sum of squares of magnitude values of the plurality of DW images $I_{inexdir}$ as:

$$I_{SOS} = \sqrt{\sum \text{abs}(I_{inexdir})^2} = \tag{7}$$

$$\sum \left(\frac{\text{abs}(I_{inexdir})^2}{\sqrt{\sum \text{abs}(I_{inexdir})^2}}\right) = \sum \left(\frac{\text{abs}(I_{inexdir})}{\sqrt{\sum \text{abs}(I_{inexdir})^2}} * \text{abs}(I_{inexdir})\right).$$

The combination is carried out pixel by pixel. That is, $\Sigma$ in Eqn. (7) is a summation of values at the same pixel of DW images $I_{inexdir}$ at different diffusion directions and separate NEX. This combination is referred to as a SOS combination herein. The SOS combination combines the magnitude of the plurality of the DW images $I_{inexdir}$. MR signals are measured through a quadrature detector that gives the real and imaginary signals. The noise in each signal can be assumed to have a Gaussian distribution. MR images are reconstructed from the MR signals by the complex Fourier transform, which is a linear operation and preserves the Gaussian characteristics of the noise. Magnitude images are formed by calculating the magnitude, pixel by pixel, from the real and imagery images as a square root of a sum of a square of the real component and a square of the imaginary component. This operation is non-linear, and the noise distribution becomes Rician. When SNR of the image is high, the noise distribution of the magnitude image may be approximated by a Gaussian distribution. When SNR of the image is low, however, the noise distribution of the magnitude image approximates Rayleigh distribution, when the image region has no MR signal. At high b-values, the SNR of a DW image is low because of the signal loss from diffusion weighting. The SOS combination is a magnitude combination, which combines the magnitude values of the plurality of DW images $I_{inexdir}$, and may change the noise distribution. The change of noise distribution affects the SNR of the diffusion-weighted images and accuracy of the estimated diffusion coefficients.

In other embodiments, the base image is a complex combination of the plurality of images $I_{inexdir}$ as:

$$I_{c3-like} = \sum \left(\frac{[I_{inexdir}]_{LowPass}}{\sqrt{\sum \text{abs}[I_{inexdir}]_{LowPass}^2}} * I_{inexdir}\right), \tag{8}$$

where * denotes complex multiplication pixel by pixel if the multiplier or multiplicand is represented by complex numbers. For example, if x+yi and u+vi are two complex numbers, (x+yi)*(u+vi)=xu−yv+(xv+yu)i. $[I_{inexdir}]_{LowPass}$ is a DW image $I_{inexdir}$ filtered by a low-pass filter. An exemplary low-pass filter is a Hanning window or a modified Hanning window. $\sqrt{\Sigma \text{abs}[I_{inexdir}]_{LowPass}^2}$ is a square root of a sum of squares of magnitude values at a pixel across diffusion directions and NEX. This combination expressed as in Eqn. (8) may be referred to as a c3-like combination. The c3-like combination is also carried out pixel by pixel. That is, $\Sigma$ in Eqn. (8) is a summation of values at the same pixel of DW images $I_{inexdir}$ at different diffusion directions and separate NEX. In one example, a low-pass filter is not applied in the c3-like combination, where $[I_{inexdir}]_{LowPass}$ in Eqn. 8 is replaced with $I_{inexdir}$. The c3-like combination is a complex combination, which does not change noise distribution. Compared to the SOS combination, a combined image combined by a c3-like combination has a lower background noise level than that a combined image combined by the SOS combination of the same set of DW images $I_{inexdir}$. The c3-like combination performs better than the SOS combination for reconstruction methods using deep learning because the neural network model used in a deep learning reconstruction is typically trained with noise having a Gaussian distribution.

In the exemplary embodiment, the reference image is a maximum intensity projection (MIP) image of the plurality of DW images $I_{inexdir}$. At each pixel, the maximum intensity projection image includes a maximum of magnitude at that pixel among the diffusion directions and the NEX. For example, if the plurality of DW images $I_{inexdir}$ are acquired along three diffusion directions and 3 NEX, at each pixel, the maximum intensity projection image is the maximum of 9 magnitude values at that pixel at different diffusion directions and separate NEX. The maximum intensity projection is carried out pixel by pixel because the entire slice or imaging volume does not move as one. In some embodiments, a low-pass filter is applied to the plurality of DW images before generating a maximum intensity projection image. That is, the maximum intensity projection image includes maximums of magnitude values pixel by pixel of a plurality of filtered DW images. In other embodiments, the reference image is the maximum intensity projection image applied with a low-pass filter after the maximum intensity projection image has been generated. An exemplary low-pass filter is a Hanning window or a modified Hanning window. Motion affects signal intensity. But motion is not present all the time or in all directions and/or does not have same speed in all directions. The effects of motion therefore may be present or less severe at certain diffusion directions or certain NEX than other diffusion directions or NEX. Accordingly, the maximum intensity projection image is least affected by motion. Advantages of using the maximum intensity projection image as a reference image are that the reference image is self generated and does not need to be separately-provided. Separately providing a reference image of diffusion images of a live subject, i.e., a diffusion-weighted image not including motion effects or having much reduced motion effects, is impractical because some parts of the live subject, such as the heart and its surrounding tissues, moves constantly, even during breath holding.

In the exemplary embodiment, a nonuniformity factor image is generated 356 based on the reference image and the base image. The nonuniformity factor image is a division of the base image by the reference image, pixel by pixel. If the reference image is a complex image, the division operation in deriving the nonuniformity factor image may be carried out as a complex division or a division by the magnitude value of the reference image pixel by pixel. For example, for complex numbers x+yi and u+vi, $(u+vi)/(x+yi)=(1/(x^2+y^2))((ux+vy)+(vx-uy)i)$. The method 350 further includes combining 358 the plurality of DW MR images into a combined image. A low-pass filter may be applied to the plurality of DW images before the combination. The combination may be any of the above combinations. The combined image and the base image may be the same or similar, where they are combined by the same combination mechanisms described above. Alternatively, the combined image and the base image are combined using different combination schemes. For example, the base image may be combined by arithmetic averaging and geometric averaging according to Eqn. (6), and the combined image used to derive a corrected image is combined using a c3-like combination according to Eqn. (8). The nonuniformity of the combined image is corrected 360 by dividing the combined image by the nonuniformity factor image. If the nonuniformity image is a complex image, the division may be a complex division or a division by the magnitude values of the nonuniformity factor image pixel by pixel. The corrected image is output 362. In some embodiments, combining 358 the plurality of DW MR images is skipped, and correcting 360 nonuniformity of the combined image becomes correcting nonuniformity of one of the plurality of the DW MR images. In some embodiments, the system 300 is configured to output the nonuniformity factor image.

In some embodiments, when the combined image and the base image are the same, the corrected image is mathematically the same as the reference image, such as the MIP image, when the corrected image is computed as the combined image divided by the nonuniformity factor image, which is the quotient of the base image divided by the reference image. In practice, however, compared to the MIP image, the corrected image has an increased SNR from the combination and averaging of multi-NEX images. Further, if motion occurs among input images, the MIP image has overlapping or ghosting artifacts at the edge of the image due to the motion, while such artifacts are reduced in the corrected image.

Figure 4:
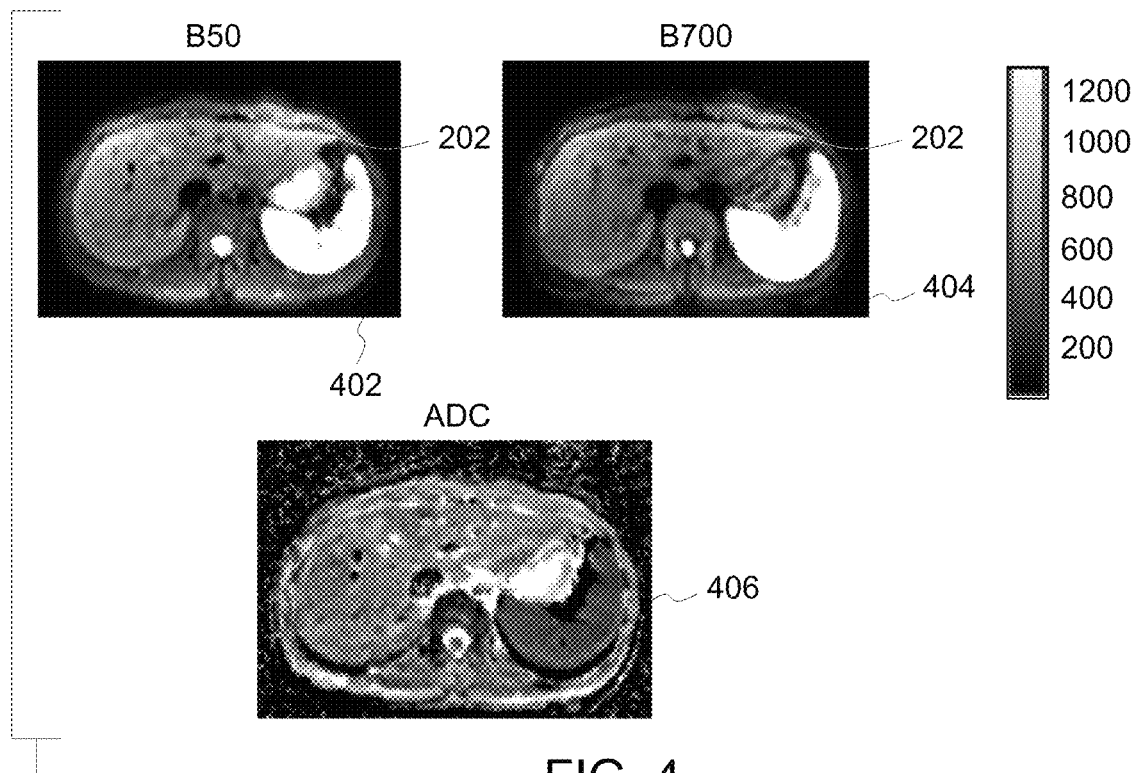
FIG. 4 shows exemplary diffusion-weighted images and apparent diffusion coefficient (ADC) map.

FIG. 4 shows DW images 402, 404 at b-values of 50 and 700 and an ADC map 406 of a liver region of a subject, using an SOS combination. Even at a high b-value of 700, the shading in the liver 202 is largely reduced, compared to the image 200 without using the nonuniformity correction systems and methods described herein.

Figure 5:
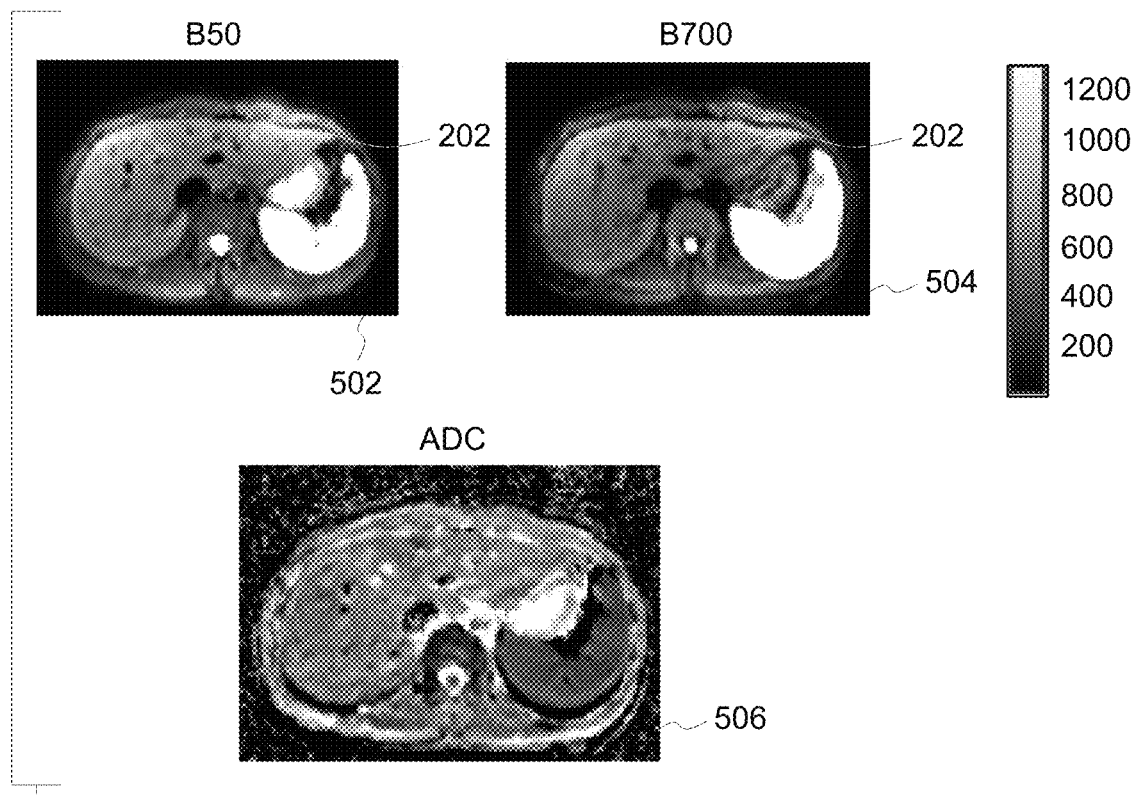
FIG. 5 shows more exemplary diffusion-weighted images and ADC map.

FIG. 5 shows DW images 502, 504 at b-values of 50 and 700 and an ADC map 506 of the same slice location as the images 402, 404 shown in FIG. 4, using a c3-like combination. Similarly, the shading at the liver 202 is largely reduced.

Figure 6:
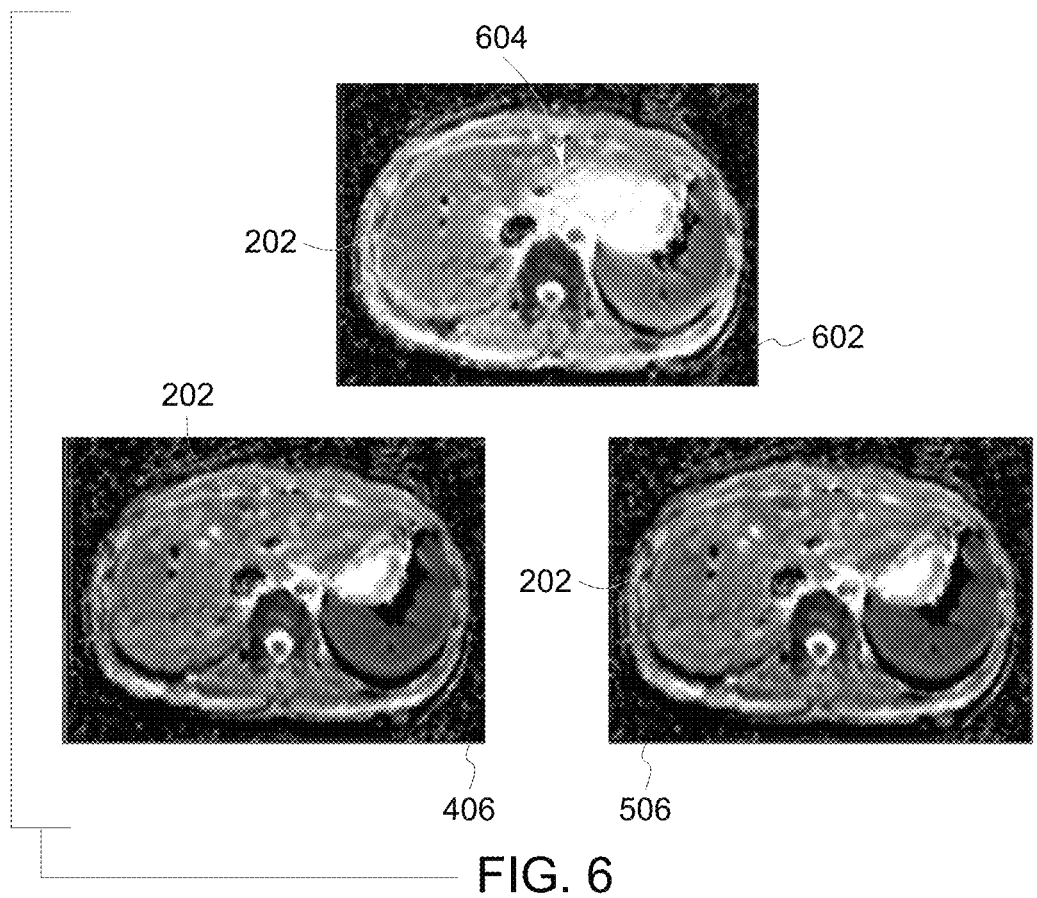
FIG. 6 is a comparison of an ADC map without using the systems and methods disclosed herein with the ADC maps shown in FIGS. 4 and 5.

FIG. 6 is a comparison of ADC maps 602, 406, 506 with (the ADC maps 406, 506) and without using nonuniformity correction (the ADC map 602), of the same slice location of the subject. Without nonuniformity correction, diffusion rates of some areas (pointed by an arrow 604) of the liver 202 is overly estimated. The overestimation negatively affects accuracy in diagnosis.

Figure 7:
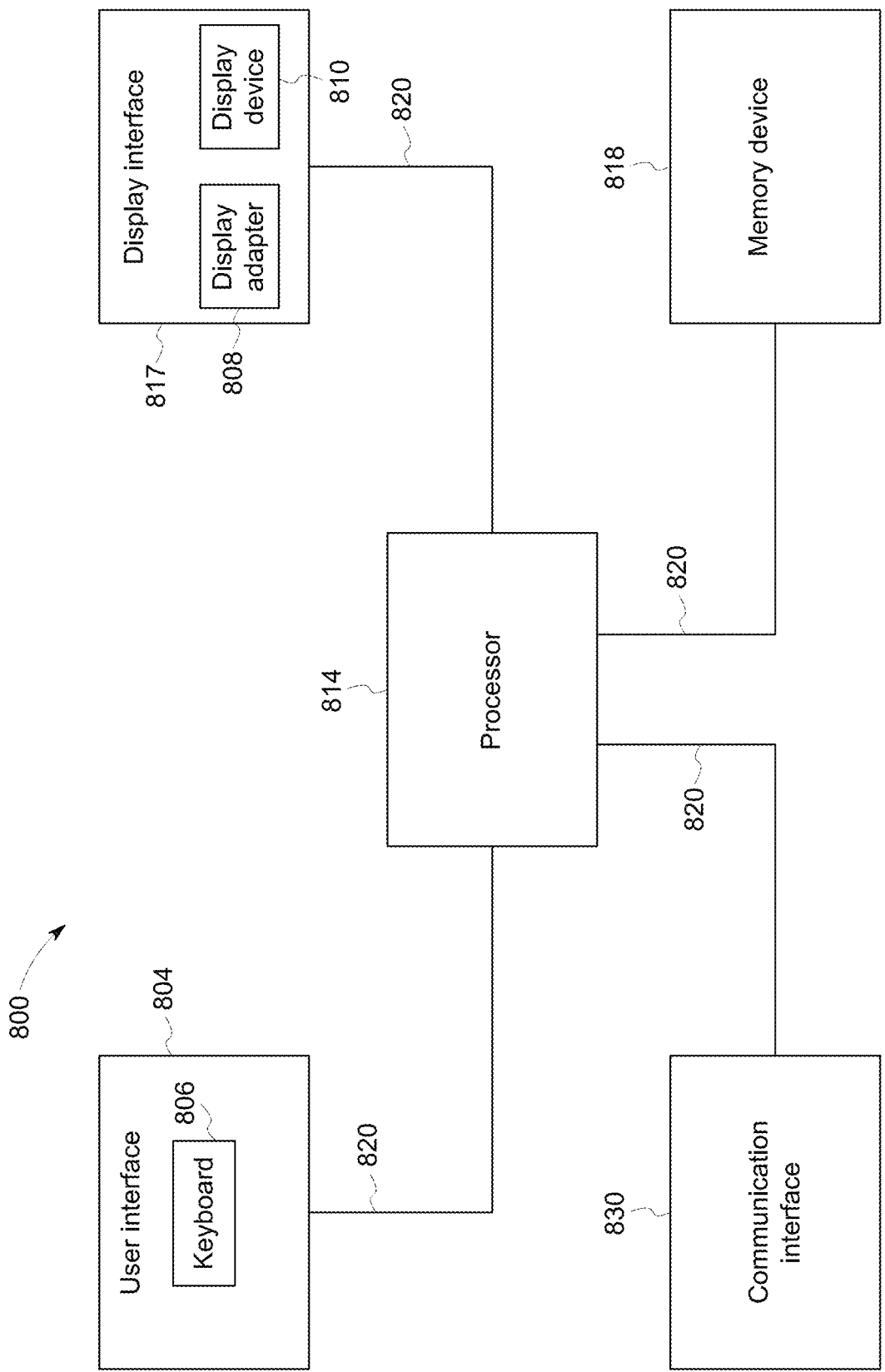
FIG. 7 is a block diagram of an exemplary computing device.

The workstation 12 and the nonuniformity correction computing device 302 described herein may be any suitable computing device 800 and software implemented therein. FIG. 7 is a block diagram of an exemplary computing device 800. In the exemplary embodiment, the computing device 800 includes a user interface 804 that receives at least one input from a user. The user interface 804 may include a keyboard 806 that enables the user to input pertinent information. The user interface 804 may also include, for example, a pointing device, a mouse, a stylus, a touch sensitive panel (e.g., a touch pad and a touch screen), a gyroscope, an accelerometer, a position detector, and/or an audio input interface (e.g., including a microphone).

Moreover, in the exemplary embodiment, computing device 800 includes a display interface 817 that presents information, such as input events and/or validation results, to the user. The display interface 817 may also include a display adapter 808 that is coupled to at least one display device 810. More specifically, in the exemplary embodiment, the display device 810 may be a visual display device, such as a cathode ray tube (CRT), a liquid crystal display (LCD), a light-emitting diode (LED) display, and/or an "electronic ink" display. Alternatively, the display interface 817 may include an audio output device (e.g., an audio adapter and/or a speaker) and/or a printer.

The computing device 800 also includes a processor 814 and a memory device 818. The processor 814 is coupled to the user interface 804, the display interface 817, and the memory device 818 via a system bus 820. In the exemplary embodiment, the processor 814 communicates with the user, such as by prompting the user via the display interface 817 and/or by receiving user inputs via the user interface 804. The term "processor" refers generally to any programmable system including systems and microcontrollers, reduced instruction set computers (RISC), complex instruction set computers (CISC), application specific integrated circuits (ASIC), programmable logic circuits (PLC), and any other circuit or processor capable of executing the functions described herein. The above examples are exemplary only, and thus are not intended to limit in any way the definition and/or meaning of the term "processor."

In the exemplary embodiment, the memory device 818 includes one or more devices that enable information, such as executable instructions and/or other data, to be stored and retrieved. Moreover, the memory device 818 includes one or more computer readable media, such as, without limitation, dynamic random access memory (DRAM), static random access memory (SRAM), a solid state disk, and/or a hard disk. In the exemplary embodiment, the memory device 818 stores, without limitation, application source code, application object code, configuration data, additional input events, application states, assertion statements, validation results, and/or any other type of data. The computing device 800, in the exemplary embodiment, may also include a communication interface 830 that is coupled to the processor 814 via the system bus 820. Moreover, the communication interface 830 is communicatively coupled to data acquisition devices.

In the exemplary embodiment, the processor 814 may be programmed by encoding an operation using one or more executable instructions and providing the executable instructions in the memory device 818. In the exemplary embodiment, the processor 814 is programmed to select a plurality of measurements that are received from data acquisition devices.

In operation, a computer executes computer-executable instructions embodied in one or more computer-executable components stored on one or more computer-readable media to implement aspects of the invention described and/or illustrated herein. The order of execution or performance of the operations in embodiments of the invention illustrated and described herein is not essential, unless otherwise specified. That is, the operations may be performed in any order, unless otherwise specified, and embodiments of the invention may include additional or fewer operations than those disclosed herein. For example, it is contemplated that executing or performing a particular operation before, contemporaneously with, or after another operation is within the scope of aspects of the invention.

At least one technical effect of the systems and methods described herein includes (a) reduction of nonuniformity; (b) increase accuracy of estimate of diffusion coefficient; and (c) correcting nonuniformity without a separately-provided reference image.

Exemplary embodiments of systems and methods of nonuniformity correction are described above in detail. The systems and methods are not limited to the specific embodiments described herein but, rather, components of the systems and/or operations of the methods may be utilized independently and separately from other components and/or operations described herein. Further, the described components and/or operations may also be defined in, or used in combination with, other systems, methods, and/or devices, and are not limited to practice with only the systems described herein.

Although specific features of various embodiments of the invention may be shown in some drawings and not in others, this is for convenience only. In accordance with the principles of the invention, any feature of a drawing may be referenced and/or claimed in combination with any feature of any other drawing.

This written description uses examples to disclose the invention, including the best mode, and also to enable any person skilled in the art to practice the invention, including making and using any devices or systems and performing any incorporated methods. The patentable scope of the invention is defined by the claims, and may include other examples that occur to those skilled in the art. Such other examples are intended to be within the scope of the claims if they have structural elements that do not differ from the literal language of the claims, or if they include equivalent structural elements with insubstantial differences from the literal language of the claims.

What is claimed is:

1. A magnetic resonance (MR) imaging method of correcting nonuniformity in diffusion-weighted (DW) MR images of a subject, comprising:
    acquiring a plurality of DW MR images of the subject along a plurality of diffusion directions with one or more number of excitations (NEX) by:
        applying a DW pulse sequence along the plurality of diffusion directions with the one or more NEX;
    deriving a reference image based on the plurality of DW MR images;
    deriving a base image based on the plurality of DW MR images;
    generating a nonuniformity factor image based on the reference image and the base image;
    combining the plurality of DW MR images into a combined image;
    correcting nonuniformity of the combined image using the nonuniformity factor image; and
    outputting the corrected image.

2. The method of claim 1, wherein generating a nonuniformity factor image further comprises generating the nonuniformity factor image by dividing the base image by the reference image, and correcting nonuniformity of the combined image further comprises correcting the nonuniformity of the combined image by dividing the combined image by the nonuniformity factor image.

3. The method of claim 1, wherein combining the plurality of DW MR images further comprises:
    for each pixel in the combined image, setting an image value of the combined image at the pixel as a square root of a sum across the diffusion directions and the NEX of squares of magnitude values of the plurality of DW MR images at the pixel.

4. The method of claim 1, wherein combining the plurality of DW MR images further comprises:
    for each pixel in the combined image,
        computing a sum across the diffusion directions and the NEX of products of complex multiplications of an image value of the plurality of DW MR images at the pixel with the image value of the plurality of DW MR images at the pixel; and
        setting an image value of the combined image at the pixel to be the sum divided by a square root of a sum across the diffusion directions and the NEX of squares of magnitude values of the plurality of DW MR images at the pixel.

5. The method of claim 1, wherein combining the plurality of DW MR images further comprises:
    applying a low-pass filter to the plurality of DW MR images to generate a plurality of filtered images; and
    for each pixel in the combined image,
        computing a sum across the diffusion directions and the NEX of products of complex multiplications of an image value of the plurality of DW MR images at the pixel with an image value of the plurality of filtered images at the pixel; and
        setting an image value of the combined image at the pixel as the sum divided by a square root of a sum across the diffusion directions and the NEX of squares of magnitude values of the plurality of filtered images at the pixel.

6. The method of claim 1, wherein deriving a reference image and a base image further comprises:
    deriving the reference image as a maximum intensity projection image based on the plurality of DW MR images.

7. The method of claim 6, wherein deriving the reference image further comprises:
    for each pixel of the reference image, setting an image value of the reference image at the pixel as a maximum among magnitude values of the plurality of DW MR images at the pixel across the diffusion directions and the NEX.

8. The method of claim 6, wherein deriving the reference image further comprises:
applying a low-pass filter to the plurality of DW MR images to derive a plurality of filtered images; and
for each pixel of the reference image, setting an image value of the reference image at the pixel as a maximum among magnitude values of the plurality of filtered images at the pixel across the diffusion directions and the NEX.

9. The method of claim 6, wherein deriving the reference image further comprises applying a low-pass filter to the reference image to derive a filtered reference image, and generating a nonuniformity factor image further comprises generating a nonuniformity factor image based on the filtered reference image and the base image.

10. The method of claim 1, wherein deriving a reference image and a base image further comprises:
applying a low-pass filter to the plurality of DW MR images to derive a plurality of filtered images; and
combing the plurality of filtered images to generate the base image.

11. The method of claim 1, wherein deriving a reference image and a base image further comprises:
for each pixel in the base image, setting an image value of the base image at the pixel as a square root of a sum across the diffusion directions and the NEX of squares of magnitude values of the plurality of DW MR images at the pixel.

12. The method of claim 1, wherein deriving a reference image and a base image further comprises:
applying a low-pass filter to the plurality of DW MR images to generate a plurality of filtered images; and
for each pixel in the base image,
computing a sum across the diffusion directions and the NEX of products of complex multiplications of an image value of the plurality of DW MR images at the pixel with an image value of the plurality of filtered images at the pixel; and
setting an image value of the base image at the pixel as the sum divided by a square root of a sum across the diffusion directions and the NEX of squares of magnitude values of the plurality of filtered images at the pixel.

13. A nonuniformity correction system of correcting nonuniformity in diffusion-weighted (DW) magnetic resonance (MR) images of a subject, comprising a nonuniformity correction computing device, the nonuniformity correction computing device comprising at least one processor in communication with at least one memory device, and the at least one processor programmed to:
receive a plurality of DW MR images of the subject along a plurality of diffusion directions with one or more numbers of excitations (NEX), wherein the plurality of DW MR images were acquired by:
applying a DW pulse sequence along the plurality of diffusion directions with the one or more NEX;
derive a reference image and a base image based on the plurality of DW MR images;
deriving a base image based on the plurality of DW MR images;
generate a nonuniformity factor image based on the reference image and the base image;
combine the plurality of DW MR images into a combined image;
correct nonuniformity of the combined image using the nonuniformity factor image; and
output the corrected image.

14. The system of claim 13, wherein the at least one processor is further programmed to:
generate the nonuniformity factor image by dividing the base image by the reference image; and
correct the nonuniformity of the combined image by dividing the combined image by the nonuniformity factor image.

15. The system of claim 13, wherein the at least one processor is further programmed to:
for each pixel in the combined image, set an image value of the combined image at the pixel as a square root of a sum across the diffusion directions and the NEX of squares of magnitude values of the plurality of DW MR images at the pixel.

16. The system of claim 13, wherein the at least one processor is further programmed to:
apply a low-pass filter to the plurality of DW MR images to generate a plurality of filtered images; and
for each pixel in the combined image,
compute a sum across the diffusion directions and the NEX of products of complex multiplications of an image value of the plurality of DW MR images at the pixel with an image value of the plurality of filtered images at the pixel; and
set an image value of the combined image at the pixel as the sum divided by a square root of a sum across the diffusion directions and the NEX of squares of magnitude values of the plurality of filtered images at the pixel.

17. The system of claim 13, wherein the at least one processor is further programmed to:
for each pixel of the reference image, set an image value of the reference image at the pixel as a maximum among magnitude values of the plurality of DW MR images at the pixel across the diffusion directions and the NEX.

18. The system of claim 13, wherein the at least one processor is further programmed to:
apply a low-pass filter to the plurality of DW MR images to derive a plurality of filtered images; and
for each pixel of the reference image, set an image value of the reference image at the pixel as a maximum among magnitude values of the plurality of filtered images at the pixel across the diffusion directions and the NEX.

19. The system of claim 13, wherein the at least one processor is further programmed to:
for each pixel in the base image, set an image value of the base image at the pixel as a square root of a sum across the diffusion directions and the NEX of squares of magnitude values of the plurality of DW MR images at the pixel.

20. The system of claim 13, wherein the at least one processor is further programmed to:
apply a low-pass filter to the plurality of DW MR images to generate a plurality of filtered images; and
for each pixel in the base image,
compute a sum across the diffusion directions and the NEX of products of complex multiplications of an image value of the plurality of DW MR images at the pixel with an image value of the plurality of filtered images at the pixel; and
set an image value of the base image at the pixel as the sum divided by a square root of a sum across the diffusion directions and the NEX of squares of magnitude values of the plurality of filtered images at the pixel.

\* \* \* \* \*